US009187845B2

(12) United States Patent
Veber et al.

(10) Patent No.: US 9,187,845 B2
(45) Date of Patent: Nov. 17, 2015

(54) METHOD FOR PREPARING SINGLE-CRYSTAL CUBIC SESQUIOXIDES AND USES THEREOF

(75) Inventors: Philippe Veber, Bordeaux (FR); Matias Velazquez, Pessac (FR); Jean-Pierre Chaminade, Talence (FR); Oudomsack Viraphong, Talence (FR)

(73) Assignee: Centre National De La Recherche Scientifique, Paris (FR)

( * ) Notice: Subject to any disclaimer, the term of this patent is extended or adjusted under 35 U.S.C. 154(b) by 643 days.

(21) Appl. No.: 13/505,632

(22) PCT Filed: Nov. 3, 2010

(86) PCT No.: PCT/FR2010/052355
§ 371 (c)(1),
(2), (4) Date: Jul. 23, 2012

(87) PCT Pub. No.: WO2011/055075
PCT Pub. Date: May 12, 2011

(65) Prior Publication Data
US 2012/0273713 A1     Nov. 1, 2012

(30) Foreign Application Priority Data
Nov. 3, 2009    (FR) ...................................... 09 57772

(51) Int. Cl.
*C09K 5/00* (2006.01)
*C30B 29/22* (2006.01)
*C30B 9/00* (2006.01)
*C30B 9/04* (2006.01)
*C30B 17/00* (2006.01)
*C30B 19/02* (2006.01)
*C30B 19/04* (2006.01)
*C30B 19/06* (2006.01)
*C30B 29/24* (2006.01)
*C30B 15/14* (2006.01)

(52) U.S. Cl.
CPC . *C30B 29/22* (2013.01); *C30B 9/00* (2013.01); *C30B 9/04* (2013.01); *C30B 17/00* (2013.01); *C30B 19/02* (2013.01); *C30B 19/04* (2013.01); *C30B 19/062* (2013.01); *C30B 29/24* (2013.01)

(58) Field of Classification Search
USPC ................. 117/2, 3, 70; 252/71; 423/263, 277
See application file for complete search history.

(56) References Cited

PUBLICATIONS

International Search Report dated Oct. 3, 2011.
Chen Changkang et al: "The Flux Growth of Scandium Oxide Crystals", Journal of Crystal Growth vol. 104, No. 3, pp. 672-676 Aug. 1, 1990.
Wanklyn B M et al: "The flux growth of large thoria and ceria crystals", Journal of Crystal Growth vol. 66, No. 2, pp. 346-350, Mar. 1, 1984.

(Continued)

*Primary Examiner* — Bijan Ahvazi
(74) *Attorney, Agent, or Firm* — Sofer & Haroun, LLP

(57) ABSTRACT

A method is provided for preparing solid or thin-film single-crystals of cubic sesquioxides (space group no. 206, Ia-3) of scandium, yttrium or rare earth elements doped with lanthanide ions with valence +III, using a high-temperature flux growth technique, and to the various uses of the single-crystals obtained according to said method, in particular in the field of optics.

19 Claims, 7 Drawing Sheets

(56) References Cited

PUBLICATIONS

Y. Guyot, R. Mongorge, L.D. Merklem A. Pinto, B. McIntosh, H. Verdu: Luminescence properties of Y2O3 single crystals doped with Pr3+ or Tm3+ and codoped with Yb3+, Tb3+or Ho3+ ions dated Jan. 1, 1996, Journal of Crystal Growth vol. 5, p. 127, col. 1, paragraph 1, Jan. 1, 1996, pp. 127-136.

Balda et al: First luminescence study of the new oxyborate Na3La9O3(BO3)8:Nd<3+> dated Jul. 24, 2007, Optical Materials, Elsevier Science, vol. 30, No. 1, pp. 122-125, Jul. 24, 2007.

METHOD FOR PREPARING SINGLE-CRYSTAL CUBIC SESQUIOXIDES AND USES THEREOF

RELATED APPLICATIONS

This application is a National Phase application of PCT/FR2010/052355, filed on Nov. 3, 2010, which in turn claims the benefit of priority from French Patent Application No. 09 57772 filed on Nov. 3, 2009, the entirety of which are incorporated herein by reference.

BACKGROUND

1. Field of the Invention

The present invention relates to a process for the preparation of bulk or thin-film single-crystals of cubic sesquioxides (space group No. 206, Ia-3) of scandium, yttrium or rare earth metals doped with lanthanide ions having a valency of +III by a high-temperature flux growth technique and to the various applications of the single-crystals obtained according to this process, in particular in the optical field.

2. Description of Related Art

A laser is a device which emits light (electromagnetic radiation) amplified by stimulated emission. The term laser is an acronym originating from "light amplification by stimulated emission of radiation". The laser produces a spatially and temporally coherent light based on the laser effect. By virtue of the stimulated emission process, the photon emitted has the same wave vector, the same polarization and the same phase as the photon moving through the optical cavity. This results in a source of coherent radiation.

Various types of laser exist, among which may in particular be mentioned gas lasers, chemical lasers, organic dye lasers, metal vapor lasers, solid-state lasers and semiconductor lasers.

Solid-state lasers use solid media, such as crystals or glasses, as medium for the emission (spontaneous and stimulated) of photons and amplifier medium. The amplifier medium, or also gain medium, is composed of an optically active material comprising a matrix (glass or crystal) rendered optically active by doping with an ion which absorbs the radiation from an optical pumping source and which is de-excited by emission of photons. The first laser is a ruby laser, the emission of which originates from the $Cr^{3+}$ ion. Other ions are much used: the majority are rare earth metal ions: $Nd^{3+}$, $Yb^{3+}$, $Pr^{3+}$, $Er^{3+}$, $Tm^{3+}$, . . . , or also transition metal ions, such as $Ti^{3+}$ or $Cr^{3+}$, inter alia. The emission wavelength of the laser depends essentially on the doping ion for the rare earth metal ions and on the properties of the matrix in all cases, the influence of the latter being much greater in the case of the transition metal ions. Thus, glass doped with neodymium does not emit at the same wavelength (1053 nm) as the crystalline solid known as yttrium-aluminum-garnet (YAG) and composed of $Y_3Al_5O_{12}$ doped with neodymium (1064 nm). Solid-state lasers operate in continuous mode or in pulsed mode (pulses from a few microseconds to a few femtoseconds). They are capable of emitting equally well in the visible region, the near infrared region, the middle infrared region and the ultraviolet region.

Above a crystal dimension of acceptable optical quality, these lasers make it possible to obtain powers of the order of approximately ten watts continuously and higher powers in pulsed mode. They are used for both scientific and industrial applications, such as welding, marking and cutting of materials.

In addition to their use in the manufacture of high-power lasers and/or short-pulse lasers, these solid materials, formed of a matrix and of a doping ion, can also be used in the manufacture of eye-safety lasers, of lasers for surgery and/or ophthalmology (diode-pumped lasers, pulsed or continuous, in the red region, the green region and up to the middle infrared region), of scintillators, of waveguides, of bolometers (detectors having heat/light discrimination), for optical cooling, as luminophoric materials or alternatively as materials for the storage and handling of quantum information.

At the current time, the most promising crystalline solids for all of these applications, and in particular for the manufacture of lasers, are cubic (thus isotropic) sesquioxides of formula $R_2O_3$ in which R represents one or more elements chosen from metals having a valency of III, such as scandium, yttrium and the rare earth metals (La, Ce, Pr, Nd, Pm, Sm, Eu, Gd, Tb, Dy, Ho, Er, Tm, Yb, Lu), doped with rare earth metal ions. Some of them exhibit in particular a greater thermal conductivity than that of YAG doped with rare earth metal ion, which is nevertheless the most widely used laser material at the current time. These cubic sesquioxides are also advantageous insofar as they can be easily doped with rare earth metal ions and have a high density (of the order of 4 to 9.5 $g.cm^{-3}$ approximately). Furthermore, yttrium, scandium, gadolinium and lutetium sesquioxides exhibit low phonon energies in comparison with the majority of oxides, in particular YAG.

At the current time, these materials are mainly obtained in the form of transparent ceramics prepared by high pressure and high temperature sintering, preferably under vacuum. However, these ceramics exhibit a polycrystalline microstructure with numerous grain boundaries, diminishing the physical properties at the basis of their applications (diffusion of photons, presence of impurities, low thermal conductivity, and the like).

In point of fact, in order to be able to be used in an optimum way in these various applications (laser, scintillator, and the like), these cubic sesquioxides have to be provided in the form of single-crystals having a size in the millimeter to centimeter range and having a satisfactory optical quality.

As a result of their very high melting point (T>2400° C.) and of their high chemical reactivity in the molten state, conditions for producing these cubic sesquioxides in the form of single-crystals and with a satisfactory optical quality prove to be difficult to implement, expensive and sometimes dangerous and most of the time require postgrowth treatments for several hours at high temperature (annealing).

Various techniques for the synthesis of single-crystals of rare earth metal sesquioxides have been reviewed by Akira Yoshikawa and Andrey Novoselov (book: Shaped Crystals; publisher: Springer Berlin Heidelberg; Part III, pages 187-202; Copyright 2007). These authors remind the reader that, as a result of their very high chemical reactivity in the molten state, these materials in principle have to be synthesized according to "crucibleless" techniques, such as, for example, the Verneuil method (R. A. Lefever et al., Rev. Sci. Instrum., 1963, 33, 769), the zone melting technique known under the term "Laser-Heated Pedestal Growth" (LHPG), as described by D. B. Gasson et al., J. Mater. Sci., 1970, 5, 100, or alternatively according to the cold-crucible or self-crucible technique, also known under the term "skull-melting" and described in particular by V. V. Osiko, J. Cryst. Growth, 1983, 65, 235. Other crystalline growth techniques, such as that of J. Czochralski (Z. Phys. Chem., 1918, 92, 219), carry out the crystallogenesis in crucibles. It is then essential to carry out the growth of the crystals in special crucibles formed of a material having a higher melting point than the melting point of the material to be grown, that is to say greater, in the present case, than 2400° C., such as crucibles made of rhenium, the melting point of which exceeds 3100° C. (L. Fornasiero et al., Cryst. Res. Technol., 1999, 34, 255). However, these techniques exhibit the disadvantage of resulting in single-crystals which are too small (at most of the order of a few millimeters) and/or which exhibit an optical quality insufficient for the applications envisaged. Akira Yoshikawa and Andrey Novoselov for their part provide for the use of a micro-pulling down (μ-PD) technique for carrying out the synthesis of single-crystals of rare earth metal sesquioxides, the principle and the use of which make it possible to produce single-crystal fibers. It concerns drawing fiber downward from a micrometer-size nozzle placed under a crucible in which the powder mixture is brought to its melting point. However, in the case of the growth of materials of the $R_2O_3$ type as defined above, this technique, however, requires a special and expensive device (sometimes not able to be operated industrially) and makes it possible to obtain only crystals in the form of fibers. It thus does not make it possible to access large-sized bulk single-crystals. In contrast, the technique known under the acronym HEM for Heat Exchanger Method, provided by V. Peters et al. (J. Cryst. Growth, 2002, 237-239, 879-883), makes it possible to obtain monocrystals of the $R_2O_3$ type having a size of several centimeters by the slow cooling of the bottom of a crucible made of rhenium comprising a molten bath of $R_2O_3$ brought to the melting point (T>2400° C.). Nevertheless, this technique is impossible to transfer to the industrial scale as a result of its very high cost (price of rhenium, for example), of its dangerousness and of the high chemical reactivity with one another of the elements present in the furnace. This is because the refractory ceramics and the rhenium crucible, in the presence of hydrogen $H_2$ (explosive gas of the growth atmosphere and consequently highly dangerous at high temperature), exhibit strong signs of chemical attack (darkening of the refractory ceramics, dissolution of the crucible resulting in contamination of the crystals) after growth and then require their replacement virtually systematically after only a few growths.

Provision has also already been made, in particular in patent application US 2009/0151621, to synthesize sesquioxides of $R_2O_3$ type, in particular of scandium, in the single-crystal form by the hydrothermal route. This process consists in dissolving an $R_2O_3$ powder, where R represents one or more elements chosen from scandium, yttrium and lanthanides, in an aqueous solution comprising hydroxide ions and in then bringing the resulting solution to a temperature of 450° C.; to 750° C. under a pressure which can range from 4 to 40 kpsi (i.e., approximately from $3 \times 10^7$ to $3 \times 10^9$ Pa.). This process results in $R_2O_3$ single-crystals, the size of which can vary from the order of a few mm to a centimeter; however, it requires operating at a very high pressure and consequently requires a suitable and necessarily expensive device. This technique exhibits the disadvantage of using solutions which are highly corrosive with their environment, then resulting in chemical attack on the silver crucibles used as container. This then results in the contamination of the crystals by the $Ag^+$ ions, which is additional to that by the $OH^-$ ions initially present in the solution. Furthermore, the rate of growth of the crystals by the hydrothermal route is very slow (generally less than 0.5 mm/day), which requires extremely lengthy growth times to hope to achieve a crystal size of the order of a centimeter.

OBJECTS AND SUMMARY

Finally, tests on the growth of scandium oxide $Sc_2O_3$ from a high temperature solution based on lead oxide PbO and/or lead fluoride $PbF_2$ (both highly toxic) and vanadium oxide $V_2O_5$ have been carried out by Chen et al. (J. Cryst. Growth, 1990, 104, 672-676). The growth temperatures employed are generally greater than 1300° C. and have resulted only in crystals of about a millimeter in size and of inadequate optical quality.

There thus currently exists no method which makes it possible, in a simple fashion and without the use of specific equipment or of extreme temperature and pressure conditions, to access single-crystals of cubic sesquioxides of scandium, yttrium or rare earth metal doped with rare earth metal ions exhibiting, at an equivalent chemical composition, a greater size than that of the single-crystals obtained according to the processes of the prior art while having very good optical properties.

The inventors thus set themselves the aim of making available a method which makes it possible to access such single-crystals.

A subject matter of the present invention is a process for the preparation of a bulk or thin-film single-crystal formed of a matrix of a cubic sesquioxide of scandium, yttrium and/or rare earth metal doped with at least one element of the series of the lanthanides, said single-crystal corresponding to the following formula (I):

$$R^1{}_2O_3{:}R^2 \qquad (I)$$

in which:

$R^1$ is at least one metal with a valency of III chosen from scandium, yttrium and the elements of the series of the lanthanides, that is to say from the elements having an atomic number ranging from 57 (lanthanum) to 71 (lutetium) according to the Periodic Table of the Elements;

$R^2$ is at least one element chosen from the series of the lanthanides;

said process being characterized in that it is carried out in a chemically inert crucible and in that it comprises the following stages consisting in:

1) preparing a pulverulent mixture (PM1) comprising at least:

one solute formed of a mechanical mixture of at least one sesquioxide of following formula (IIa) in a molar percentage (1-x) and of at least one sesquioxide of following formula (IIb) in a molar percentage (x):

$$(R'^1{}_2O_3)_{1-x} (IIa) + (R'^2{}_2O_3)_x \qquad (IIb)$$

in which $R'^1$ is identical to $R^1$, $R'^2$ is identical to $R^2$ and $0 < x \le 25$ mol %, said solute being present in the mixture PM1 in an amount z such that $5 < z \le 30$ mol %, a synthesis solvent of following formula (III):

$$[Li_6(R'''^1{}_{1-x'}R''^2{}_{x'})(BO_3)_3] \qquad (III)$$

in which:

$R'''^1$ and $R''^2$ are respectively identical to $R^1$ and to $R^2$ and $x' = x$;

2) bringing the pulverulent mixture PM1 obtained above in stage 1) to a temperature $T_{PM1}$ at least equal to the melting point ($T_{M.p.}$) of said mixture and ≤1250° C., in order to bring about the dissolution of the solute in the solvent of formula (III) and to obtain a liquid solution of said solute in the solvent of formula (III);

3) maintaining the temperature of the liquid solution at the temperature $T_{PM1}$ for a period of time of at least 6 hours, with stirring by means of a solid support subjected to rotation around a vertical axis;

4) the controlled cooling of the liquid solution from the temperature $T_{PM1}$ down to a temperature $T_{Exp}$ between the saturation temperature ($T_{Sat}$) of the liquid solution and the critical supersaturation temperature ($CT_{Super}$) of the liquid solution or the temperature of solidification of the solution, in order to bring about the controlled crystallization of the expected sesquioxide of formula (I) on said solid support immersed in said liquid solution and subjected to rotation around a vertical axis, said cooling being carried out at a maximum rate of $1°$ C.h$^{-1}$;

5) the withdrawal of the solid support from the liquid solution and then the controlled cooling of the sesquioxide of formula (I) crystallized on the solid support from the temperature $T_{Exp}$ down to ambient temperature, at a maximum rate of $50°$ C.h$^{-1}$.

Within the meaning of the present invention, the term "identical" used to describe the $R'^1$, $R''^1$, $R'^2$ and $R''^2$ radicals with reference to $R^1$ and $R^2$ means that $R'^1$ and $R''^1$ represent the same element as $R^1$ and that $R'^2$ and $R''^2$ represent the same element as $R^2$. Thus, and by way of example, when $R^1$ is yttrium (Y), $R'^1=R''^1=Y$ and, when $R^2$ is ytterbium (Yb), $R'^2=R''^2=Yb$.

Saturation temperature is understood to mean the temperature at which the solubility limit of the solute in the solution is reached (solubility equilibrium). At this temperature, and above a certain amount of solute already introduced and dissolved in solution, the additional solute can precipitate in the solid form. The saturation temperature depends on the molar fraction "z" of the solute in the solution. The solubility equilibrium as a function of the molar fraction of the solute in the solution is then described by the liquidus curve in a Solvent/Solute phase diagram, as appears in the appended FIG. 1.

The critical supersaturation temperature is the temperature at which the precipitation of the solute occurs spontaneously. Below this limit, which is also a function of the molar fraction "z" of the solute in the solution, the crystallization of the solute cannot be controlled and takes place spontaneously.

The supersaturation temperature ($T_{Super}$) is a temperature lower than the saturation temperature and greater than the critical supersaturation temperature. It corresponds to a range of temperatures in which the solute occurs in a metastable state which allows it to crystallize in a controlled way without precipitation occurring. The thermodynamically metastable region is between the saturation temperature and the critical supersaturation temperature; it is a function of the molar fraction "z" of the solute in the solution and is called the "Ostwald-Miers region" (see appended FIG. 1).

According to the invention, $T_{Exp}$ thus corresponds to the "experimental" temperature at which the controlled crystallization of the sesquioxide of formula (I) is carried out; as indicated above, this temperature is between the saturation temperature ($T_{Sat}$) of the liquid solution and the critical supersaturation temperature ($CT_{Super}$) of the liquid solution or the temperature of solidification of the solution; for a given solute, this temperature is in the Ostwald-Miers region.

These definitions are found in the work D. Elwell and H. J. Scheel. Crystal Growth from High-Temperature Solutions, Academic Press, 1975, chapter 4 (pp. 138-201) and chapter 7 (pp. 278-432).

Still according to the invention, "thin film" is understood to mean a film having a thickness which varies from 1 to 500 µm and preferably from 1 to 100 µm.

In comparison with the processes of the prior art, the process in accordance with the present invention exhibits the following advantages:

the melting point of the synthesis solvent of formula (III) is of the order of approximately $860°$ C. This makes it a satisfactory flux, sparingly volatile and chemically inert under various types of atmosphere (reducing, air, oxidizing);

by virtue of the use of the synthesis solvent of formula (III), the growth of the single-crystals of formula (I) can be carried out at low temperature (between 1000 and $1200°$ C.) under conditions which are easy to employ from an industrial viewpoint (work possible both for atmospheric pressure and under pressure), whereas the most commonly used processes involve extreme thermodynamic conditions: very high temperatures, very high pressures;

the constituent trivalent ions (Sc, Y, rare earth metals) of the synthesis solvent of formula (III) are the same as those of the sesquioxides of formulae (IIa) and (IIb) (($R'^1_2O_3$) and ($R'^2_2O_3$)), and the other ions ($Li^+$ and $BO_3^{3-}$) of the synthesis solvent do not dissolve in the sesquioxides of formulae (IIa) and (IIb), which results in single-crystals being obtained which have a high crystalline quality, in particular because they do not comprise OH groups;

the synthesis solvent of formula also known as "flux", exhibits the advantage of not being corrosive at high temperature (in the temperature range used according to the process in accordance with the invention) to its environment;

the rate of growth of the single-crystals is at least equivalent to that observed on carrying out a process of synthesis by the hydrothermal route;

the relatively moderate (1000 to $1200°$ C. approximately) crystallization temperatures achieved by virtue of the use of this solvent of formula (III) make it possible to envisage the stabilization, in the oxidation state (+3), of certain rare earth metal ions which can be easily reduced to the oxidation state (+2), such as europium (Eu), ytterbium (Yb), samarium (Sm) and thulium (Tm), for example;

the crystallogenesis process is relatively inexpensive to carry out, without a specific safety problem, it is as well suited to the growth of bulk crystals (conventional flux technique) as that of thin films, for example by liquid phase epitaxy (LPE), when the support is an oriented single-crystal or polycrystalline rare earth metal sesquioxide;

it results in single-crystals having a good crystalline quality (no oxygen gaps, lower concentration in dislocations) not requiring post-growth heat treatments (annealing);

the doping is carried out easily (same doping ion(s) as the constituent cation(s) of the oxide matrix of the single-crystal of formula (I));

the process results in single-crystals which can reach a size of about a centimeter.

In the above formula (I), it is indicated that $R^1$ represents at least one metal having a valency of III. This means that $R^1$ can either be a single element chosen from scandium, yttrium and the elements of the series of the lanthanides or a combination of at least 2 of these elements, such as, for example, a Y/Gd, Gd/La, Y/Lu, Gd/Lu, La/Lu, Y/La, Y/Sc, Gd/Sc or Lu/Sc combination. In this case, the crystal of formula (I) is what it is appropriate to call a solid solution doped with at least one rare earth metal ion.

In the same way, in the above formula (I), it is indicated that $R^2$ represents at least one element chosen from the series of the lanthanides. This means that $R^2$ can either be a single element or a combination of at least 2 of these elements, such as, for example, a Yb/Pr, Yb/Tm, Yb/Tb, Yb/Ho, Er/Yb, Tm/Tb, or Tm/Ho combination; the term used is then codoping or codoped crystal.

According to a preferred embodiment of the invention, $R^1$ is chosen from the elements Y, Gd, Sc and Lu and the combinations of elements Y/Gd, Y/Sc, Gd/Sc, Lu/Sc, Gd/La, Gd/Lu and Y/Lu.

Again according to a preferred embodiment of the invention, $R^2$ is chosen from the elements Yb, Tm, Er, Pr, Tb, Nd, Ce, Ho, Eu, Sm and Dy and the combinations of elements Yb/Tm, Yb/Pr, Tm/Ho, Er/Yb, Yb/Tb, Yb/Ho and Tm/Tb.

According to a preferred embodiment of the invention, said process is carried out for the preparation of sesquioxides of formula (I) chosen from $Y_2O_3$:Yb; $Y_2O_3$:Pr; $Y_2O_3$:Eu, $Y_2O_3$: Nd; $Y_2O_3$:Tm; $Gd_2O_3$:Yb; $Gd_2O_3$:Pr; $Gd_2O_3$:Eu; $Gd_2O_3$:Nd; $Gd_2O_3$:Tm; $Lu_2O_3$:Yb; $Lu_2O_3$:Pr; $Lu_2O_3$:Eu; $Lu_2O_3$:Nd; $Lu_2O_3$:Tm; $(Y,Gd)_2O_3$:Yb; $(Y,Gd)_2O_3$:Pr; $(Y,Gd)_2O_3$:Eu; $(Y,Gd)_2O_3$:Nd; $(Y,La)_2O_3$:Pr; $(Gd,La)_2O_3$:Pr; $(Gd,La)_2O_3$:Yb; $(Gd,La)_2O_3$:Eu; $(Gd,La)_2O_3$:Nd; $(Y,La)_2O_3$:Yb; $Y_2O_3$:Er:Yb; $Y_2O_3$:Pr:Yb; $Gd_2O_3$:Er:Yb; $Gd_2O_3$:Pr:Yb; $Gd_2O_3$:Tm:Yb; $Lu_2O_3$:Tm:Yb; $Y_2O_3$:Tm:Ho; $Y_2O_3$:Tm:Yb, $Y_2O_3$:Tm:Tb, $Sc_2O_3$:Eu, $(Y,Lu)_2O_3$:Eu and $(Gd,Lu)_2O_3$:Eu.

Within the meaning of the present invention, "solute" refers to the mechanical mixture composed of at least one constituent sesquioxide of formula (IIa) of the matrix and of at least one sesquioxide of formula (IIb) comprising the doping ion (or ions).

As was defined above, the solute is present in an amount z such that $5<z \leq 30$ mol % of the mixture PM1. This amount corresponds to the maximum amount of solute crystallizable in the single-crystal form from the solvent of formula (III) in a range of temperatures of less than 1200° C.

According to a preferred embodiment of the invention, the amount z of solute present in the pulverulent mixture PM1 is >10 mol % and ≤30 mol % and more preferably still $15 \leq z \leq 20$ mol %.

According to a form, also preferred, of the invention, $0<x'=x' \leq 5$ mol %.

According to a specific and preferred embodiment of the invention, the pulverulent mixture PM1 produced during stage 1) and comprising the solute formed of the mechanical mixture of the sesquioxides of formulae (IIa) and (IIb) and the synthesis solvent of formula (III) is prepared according to a process comprising the substages consisting in:

i) preparing, by mechanical grinding, a pulverulent mixture (PM2) comprising 6 mol of $Li_2CO_3$, 6 mol of $H_3BO_3$ and (1+z') mol of the mechanical mixture of the sesquioxides of formulae (IIa) and (IIb), with z'/(2+z')=z;

ii) subjecting the mixture PM2 to a heat treatment comprising:
 a rise in temperature up to a temperature T1 of from 400 to 500° C. approximately, according to a temperature rise gradient of from 120 to 180° C.h$^{-1}$ approximately,
 a stationary phase during which the temperature T1 is maintained for from 6 to 12 hours approximately,
 a rise in temperature up to a temperature T2 of from 700 to 800° C. approximately, according to a temperature rise gradient of from 120 to 180° C.h$^{-1}$ approximately,
 a stationary phase during which the temperature T2 is maintained for from 6 to 12 hours approximately,
 a return to ambient temperature with a cooling gradient of from 120 down to 180° C.h$^{-1}$ approximately, in order to obtain a solid material in the form of particles, said material being composed of the synthesis solvent of formula (III) as a mixture with z mol % of solute;

iii) mechanically grinding the solid material obtained above in stage ii) in order to obtain the pulverulent mixture PM1.

The grinding of stage iii) above makes it possible to reduce the particle size of the solid material obtained in the form of coarse particles in stage ii) above and to obtain the mixture PM1 in the form of an intimate mixture of the synthesis solvent of formula (III) and of the solute.

During stage 2), the temperature $T_{PM1}$ is preferably from 1200° C. to 1250° C. and the rate at which the mixture PM1 is brought to the temperature $T_{PM1}$ is preferably of the order of 120° C.h$^{-1}$.

During stage 4), the temperature $CT_{Super}$ is preferably of the order of 1000° C. approximately and the controlled cooling of the liquid solution from the temperature $T_{PM1}$ down to a temperature $T_{Exp}$ is preferably carried out at a rate of from 0.1 to 1° C.h$^{-1}$.

According to a specific embodiment of the process, stage 4) of controlled cooling can be carried out by pulling the crystal, that is to say by slowly raising the solid support, still under rotation, according to a vertical movement. This pulling makes it possible to favor a given direction of growth according to a well determined family of planes with the aim of resulting in a single-crystal corresponding to the physical properties desired for the latter as a function of the application envisaged. In this case, the pulling can be carried out at a pull rate ($R_P$) such that $0.01 \leq R_P \leq 0.1$ mm.h$^{-1}$.

According to a preferred embodiment of the invention, stage 4) is carried out without pulling the crystal ($R_P=0$ mm.h$^{-1}$).

The solute used in stage 1) of the process in accordance with the invention is not a commercial product. It can be prepared by simple mixing and grinding of (1-x) mol % of at least one commercial sesquioxide of following formula (IIa) (matrix):

$$R'^1_2O_3 \qquad (IIa)$$

in which $R'^1$ is a metal with a valency of III chosen from scandium, yttrium and the elements of the series of the lanthanides, and of x mol % of at least one commercial sesquioxide of the following formula (IIb) (doping oxide):

$$R'^2_2O_3 \qquad (IIb)$$

in which $R'^2$ is an element chosen from the series of the lanthanides.

The various stages of the process in accordance with the invention, and also the substages i) to iii) of stage 1), if appropriate, are carried out in a crucible which is chemically inert with respect to the entities which it contains. Such a crucible can, for example, be chosen from platinum, iridium or glassy carbon crucibles.

When a platinum crucible (only in this case) is used, the various stages of the process can be carried out in air (ambient atmosphere) except when $R^1$ and/or $R^2$ denotes cerium (Ce); the stages of the process are then preferably carried out under a neutral or reducing atmosphere, for example under argon comprising 5% by volume of hydrogen. When an iridium or glassy carbon crucible is used, the stages of the process are preferably carried out under a neutral atmosphere, for example under argon, but can nevertheless be carried out under a reducing atmosphere, although this is not preferred, except with cerium.

The solid crystallization support is preferably composed of a platinum paddle or of a platinum wire attached to an alumina rod or alternatively of an oriented crystal seed attached to a platinum wire itself suspended from an alumina rod.

According to a preferred embodiment, the solid crystallization support is a platinum paddle in the form of a shovel, of platinum wire (diameter of the order of a millimeter) or of an inverted "T" made of platinum (in this case, the horizontal bar of the "T" is parallel to the bottom of the crucible).

When the single-crystal of formula (I) is grown by using, as solid support, an oriented single-crystal or polycrystalline seed, the latter is then of the same chemical and/or structural nature as the solute which it is desired to crystallize (for example, a rare earth metal sesquioxide). The seed is then immersed in the liquid solution in order for growth by liquid phase epitaxy (LPE) of the solute to be able to be carried out on said seed, which is also the case when the platinum objects mentioned above are used. When growth is carried out by LPE, the single-crystal of formula (I) is obtained in the form of a thin film.

The various stages of the process requiring a heat treatment without stirring (stage 2) and substage ii) of stage 1)) are preferably carried out in a vertical tubular furnace or in a muffle furnace.

The various stages of the process requiring a heat treatment with stirring (stages 3) and 4)) are preferably carried out in a vertical tubular furnace equipped with a paddle for homogenizing and countering sedimentation of the liquid solution and which can act as crystallization support, said paddle being integral with a mechanical rotation/translation/weighing system via the solid crystallization support (seed or platinum wire or platinum paddle) attached to an alumina rod itself connected to the rotation/pulling/weighing system.

Stage 5) of the process is preferably carried out in the vertical tubular furnace without stirring.

During stages 3) and 4), and 5), the rotational speed of the solid support preferably varies from 20 to 50 revolutions/min and more particularly still from 20 to 35 revolutions/min during the controlled cooling (crystallization) stages 4) and 5).

According to a preferred embodiment of the process of the invention, the cooling of stage 4) is carried out at a rate of 0.5° $C.h^{-1}$ from the temperature $T_{PM1}$ down to a temperature $CT_{Super}$ of 1000° C., after the support has been extracted from the liquid and positioned above the liquid solution, and then the temperature of 1000° C. is maintained for a time of less than 1 hour (thermalization) before carrying out the cooling mentioned in stage 5). In this case, the cooling of stage 5) is preferably carried out at a rate of less than 50° $C.h^{-1}$ approximately.

According to another preferred embodiment of the process of the invention, the cooling of stage 4) is a "sawtooth" cooling, that is to say a heat treatment comprising an alternation of cooling stages and of temperature-rise stages in which the amplitude of each temperature-rise stage is less than the amplitude of the cooling stage which precedes it. According to a specific embodiment of implementation, the cooling of stage 4) is carried out according to the following heat treatment:

i) cooling the liquid solution from the temperature $T_{PM1}$ down to 1150° C. at a rate of 1° $C.h^{-1}$, ii) rise in temperature from 1150° C. to 1180° C. at a rate of 120° $C.h^{-1}$, iii) cooling from 1180° C. to 1100° C. at a rate of 0.7° $C.h^{-1}$, iv) rise in temperature from 1100° C. to 1150° C. at a rate of 120° $C.h^{-1}$, v) cooling from 1150° C. to 1000° C. ($CT_{Sat}$) at a rate of 0.5° $C.h^{-1}$, In this case, the cooling of stage 5) is preferably carried out at a rate of 50° $C.h^{-1}$ approximately.

Carrying out stage 4) according to such a "sawtooth" heat treatment exhibits the advantage of limiting multiple heterogeneous nucleation on the solid support (seed, platinum paddle or wire) and thus facilitates the production of just one single-crystal of good quality.

Due to their very good crystalline qualities and their large size, the single-crystal sesquioxides of formula (I) obtained according to the process in accordance with the present invention can advantageously be used in the optical field.

Another subject matter of the invention is the use of a single-crystal sesquioxide of formula (I) as defined above and obtained according to the process in accordance with the present invention for optical applications in the manufacture of materials for optical cooling.

DETAILED DESCRIPTION

Figure 1:
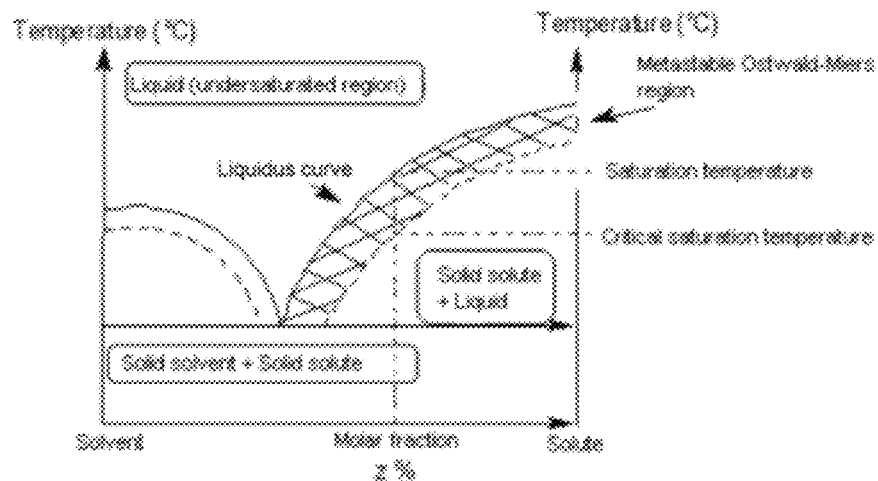
FIG. 1 is a diagram of the solubility equilibrium as a function of the molar fraction of the solute in the solution described by the liquidus curve in a Solvent/Solute phase.

The present invention is illustrated by the following implementational examples, to which, however, it is not limited.

EXAMPLES

The starting materials used in these examples are powders with a purity of 99.999%.

Before they were used, the yttrium oxide, gadolinium oxide and lutetium oxide powders were heated separately beforehand in order to obtain completely dehydrated powders, according to the following heat treatment:

1) gradient of 180° $C.h^{-1}$ up to 500° C. and then a stationary phase lasting 12 h;

2) gradient of 180° $C.h^{-1}$ up to 1000° C. and then a stationary phase lasting 2 h;

3) cooling down to ambient temperature with a cooling rate of 180° $C.h^{-1}$.

This heat treatment was carried out in a platinum crucible under ambient atmosphere (air).

The dehydrated powders were then subsequently used in the crystal syntheses in the hour which followed the end of the abovementioned heat treatment in order to prevent any uptake of moisture.

The other powders were used as received from the manufacturer.

The reactions of the synthesis of the powders of solute and the synthesis solvent of formula (III) can be carried out simultaneously in the same platinum crucible after prior intimate mixing and grinding of these with one another.

Example 1

Crystallogenesis of $Y_2O_3$ Single-Crystals 5% (Molar) Doped with Ytterbium

In this example, single-crystal cubic sesquioxides of yttrium doped with ytterbium: $Y_2O_3:Yb^{3+}$, were prepared using $[Li_6(Y_{0.95}Yb_{0.05})(BO_3)_3]$ as synthesis solvent.

1) First Stage: Preparation of a Solute Composed of a Mechanical Mixture of Yttrium Sesquioxide and Ytterbium Sesquioxide:

The solute was prepared by mechanically mixing 0.95 mol % of $Y_2O_3$ and 0.05 mol % of $Yb_2O_3$.

The commercial $Y_2O_3$ and $Yb_2O_3$ powders were mixed according to the stoichiometric proportions indicated above and then intimately ground in a mortar in order to obtain the finest particle size possible and the most homogeneous mechanical mixing possible.

2) Second Stage: Preparation of the Synthesis Solvent $[Li_6(Y_{0.95}Yb_{0.05})(BO_3)_3]$ The solvent was synthesized according to the following reaction 1:

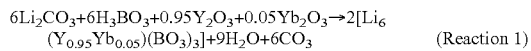

$6Li_2CO_3+6H_3BO_3+0.95Y_2O_3+0.05Yb_2O_3 \rightarrow 2[Li_6(Y_{0.95}Yb_{0.05})(BO_3)_3]+9H_2O+6CO_3$ (Reaction 1)

The commercial $Li_2CO_3$, $H_3BO_3$, $Y_2O_1$ and $Yb_2O_3$ powders were mixed according to the stoichiometric proportions indicated by reaction 1 above and then intimately ground in a mortar in order to obtain the finest particle size possible and the most homogeneous mechanical mixing possible. The mixture was subsequently heated in a platinum crucible under an air atmosphere according to the following heat treatment:

1) gradient of 180° $C.h^{-1}$ up to 450° C. and then a stationary phase lasting 12 h;
2) gradient of 180° $C.h^{-1}$ up to 750° C. and then a stationary phase lasting 12 h;
3) cooling down to ambient temperature with a cooling rate of 180° $C.h^{-1}$.

The synthesis solvent $[Li_6(Y_{0.95}Yb_{0.05})(BO_3)_3]$ thus obtained was subsequently ground using a mortar and a pestle made of agate.

3) Third Stage: Crystallogenesis of the $Y_2O_3:Yb^{3+}$ Single-Crystals 88.199 g (80.2 mol %) of synthesis solvent $[Li_6(Y_{0.95}Yb_{0.05})(BO_3)_3]$ obtained above in stage 2) and 16.369 g (19.8 mol %) of the mechanical mixture of oxides prepared above in stage 1) were intimately mixed and ground together in a mortar in order to obtain the finest particle size possible and the most homogeneous mechanical mixing possible. This mixture was subsequently placed in a platinum crucible.

The solution was subsequently melted under air, in a vertical tubular furnace, by first of all applying a temperature rise gradient of 180° $C.h^{-1}$ up to 1200° C.

Figure 2:
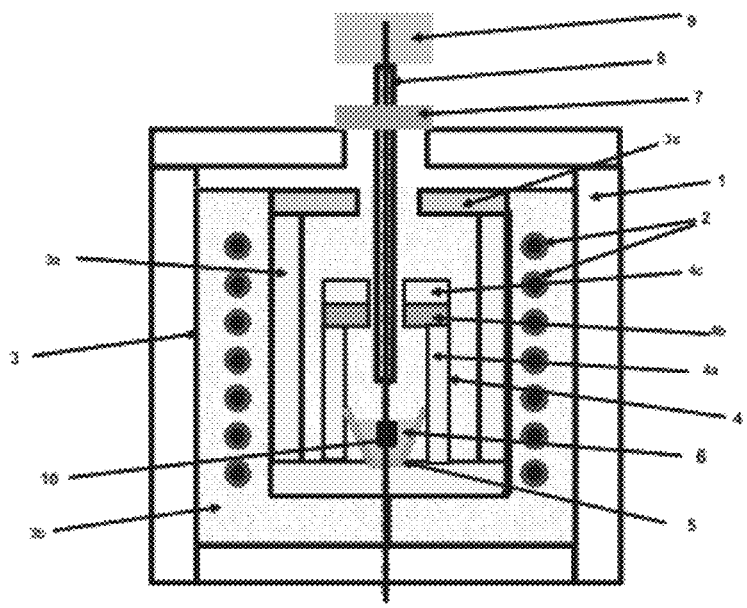
FIG. 2 shows a The vertical tubular furnace of example 1.

The vertical tubular furnace used in this example and in the examples which follow is represented in the appended FIG. 2. It comprises a water-cooled stainless steel chamber (1) in which are positioned heating elements (2) and an internal chamber (3) made of refractory material composed of an alumina tube (3a), of Fibrothal® and silica wool (3b) and of an alumina washer (3c). The internal chamber (3) includes a heat reflector (4) positioned around a crucible (5) containing the molten reaction mixture (solution) (6), said heat reflector (4) being composed of a backing alumina tube (4a) for the reflector (4) surmounted by a platinum washer (4b) itself surmounted by an alumina washer (4c). On its upper part, the chamber (1) is provided with a leaktight passage (7) guaranteeing the growth atmosphere in the chamber of the furnace, through which passes an alumina rod (8) integral with a mechanical rotation/translation system and with a weighing device (balance having an accuracy of $10^{-3}$ g) (9) and comprising, at its end, a solid support for homogenizing and countering sedimentation of the solute (10) by stirring the solute in the solvent for the growth of the single-crystal, said support (10) being immersed in the reaction mixture (6) present in the crucible (5).

The support (10) can be composed of a platinum paddle or of a platinum wire which are attached to an alumina rod or alternatively of an oriented crystal seed attached to a platinum wire itself suspended from an alumina rod.

In this example, the solid support (10) which was used was a platinum paddle in the form of an inverted T.

The temperature gradients in the furnace (radial and longitudinal gradients) are of the order of 1° $C.cm^{-1}$, so that the minimum temperature of the reaction mixture is located at the center and at the surface of the reaction mixture.

The heat reflector (4), provided with the platinum washer (thickness>1 mm) (4b) as well as an alumina washer (thickness>2 mm) (4c), makes it possible to reduce the temperature gradients. The temperature in the reaction mixture is thus rendered homogeneous.

After thermalization, the paddle was immersed by translation along the axis of the furnace (1) and of the crucible (5) into the reaction mixture down to a height of 1 mm from the bottom of the crucible, so that only the platinum constituting the paddle (10) is in contact with the molten reaction mixture and so that the end of the alumina rod (8) (point of attachment in between the platinum paddle and the rod) is at least at more than 1 cm from the surface of the reaction mixture.

Stirring by rotation around the axis of the rod, of the order of 30 revolutions/min, was carried out for 4 hours at 1200° C. with the aim of thoroughly homogenizing the dissolved entities (solute) in the flux and of preventing them from sedimenting, if appropriate.

Growth was carried out on the paddle (cold point). This support was immersed at 1200° C. by translation in the reaction mixture close to the surface at the center of the crucible. In view of the high viscosity of the molten bath, sufficient stirring, of the order of 20 rev/min or more, proved to be necessary in order to keep the entities dissolved throughout the liquid phase and to alleviate the effects of sedimentation of the solute.

Crystal growth was carried out according to the following heat treatment program:
slow cooling at a rate of 0.5° $C.h^{-1}$ from 1200° C. to 1035° C.,
no pulling from the solution,
extraction of the paddle above the molten bath,
cooling down to ambient temperature at a rate of 42° $C.h^{-1}$.

Figure 3:
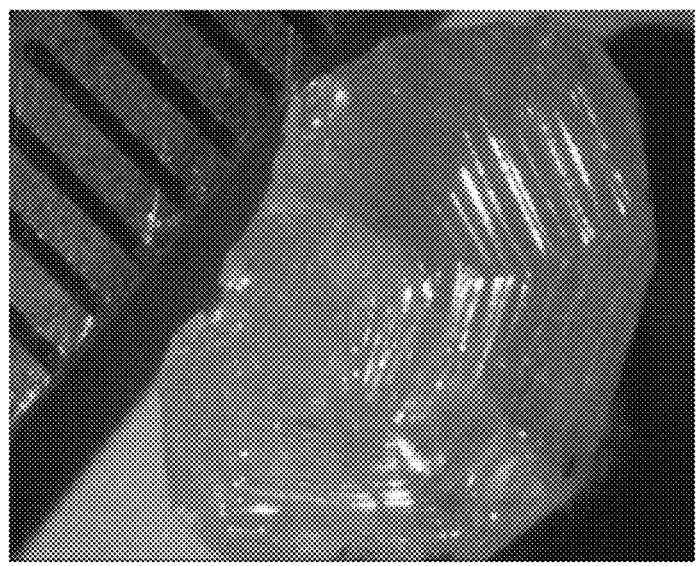
FIG. 3 is a photograph of the $Y_2O_3:Y^{3+}$ single-crystals of example 1.

$Y_2O_3:Yb^{3+}$ single-crystals were thus obtained; the photograph of one of them is given by the appended FIG. 3 (magnification×20). In this figure, a $Y_2O_3:Yb^{3+}$ crystal has been placed opposite a ruler graduated in millimeters. It is observed that the crystal exhibits a size of the order of a centimeter.

The $Y_2O_3:Yb^{3+}$ crystal thus obtained was characterized by spectrofluorimetry at ambient temperature, using a spectrofluorometer sold under the trade name FluoroLog-3 ® by HORIBA Jobin Yvon, using as excitation source a 450 W Xe lamp with an excitation wavelength of 240 nm. The emission spectrum is represented in the appended FIG. 4 in which the intensity of the emission (in arbitrary units) is a function of the wavelength λ (in nm).

Figure 4:
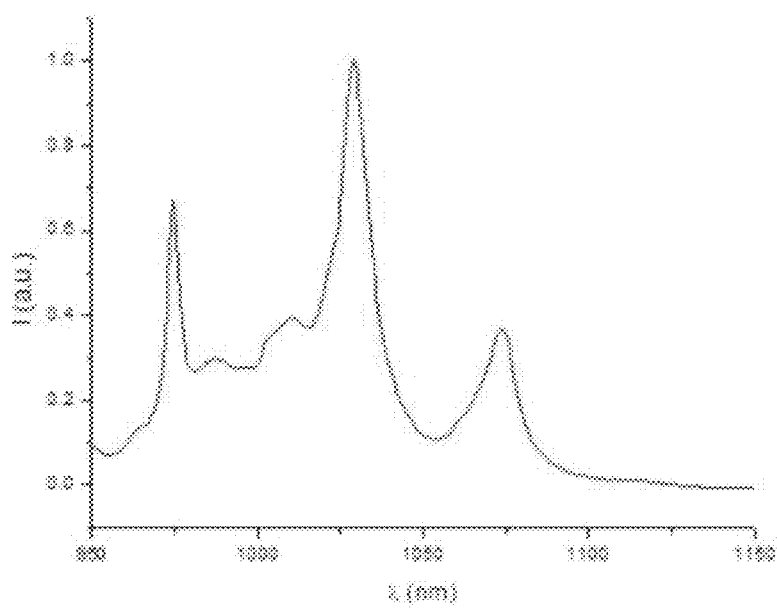
FIG. 4 is an emission spectrum of $Y_2O_3:Yb^{3+}$ of example 1.

The emission spectrum represented in FIG. 4 shows the incorporation of the trivalent ytterbium in the $Y_2O_3$ matrix (position of the emission lines between the $^2F_{5/2}$ and $^2F_{7/2}$ levels in agreement with the literature: Doctoral Thesis 2006, Université Claude Bernard Lyon I, Order No.: 66-2007, Sana Hraiech, "*Monocristaux cubiques de sesquioxides $Ln_2O_3$ (Ln=Y, Lu et Sc) et de fluorures $CaF_2$ dopés par l'ion terre rare laser $Yb^{3+}$: Croissance, caractérisations structurale et spectroscopique [Cubic single-crystals of $Ln_2O_3$ sesquioxides (Ln=Y, Lu and Sc) and of fluoride $CaF_2$ doped with the $Yb^{3+}$ laser rare earth metal ion: Growth, structural characterizations and spectroscopic characterizations].*"

Figure 5:
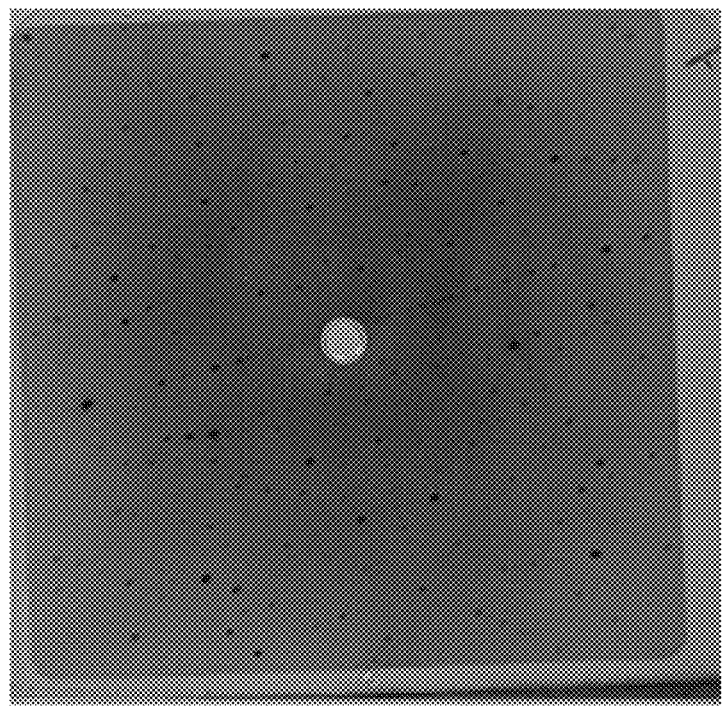
FIG. 5 is Laue diffraction diagram of example 1.

Furthermore, the Laue diffraction diagram obtained with the Laue method [J. J. Rousseau, *Cristallographie géométrique et radiocristallographie [Geometrical crystallography and radiocrystallography]*, Masson, 1995 (ISBN 2-225-84990-0), chap. 11 ("Laue Diagrams")] is represented in the appended FIG. 5. Briefly, the Laue method is a radiocrystallography method which consists in collecting the diffraction photograph of a polychromatic beam of X-rays of a stationary single-crystal.

The measurements were made on a natural face of the oriented (−2 −1 −1) $Y_2O_3$:$Yb^{3+}$ single-crystal, on a goniometer sold under the reference GM WS series X-ray by Delta Technologies International, using a copper anticathode and a photographic film of the Kodak Industrex®-AA400 brand.

This diagram is in accordance with the expected theoretical structure and confirms the cubic structure of the $Y_2O_3$:$Yb^{3+}$ single-crystal obtained.

Example 2

Crystallogenesis of $Gd_2O_3$ Sink-Crystals 5% (Molar) Doped with Ytterbium

In this example, single-crystal cubic sesquioxides of gadolinium doped with ytterbium: $Gd_2O_3$:$Yb^{3+}$, were prepared using $[Li_6(Gd_{0.95}Yb_{0.05})(BO_3)_3]$ as synthesis solvent.

1) First Stage: Preparation of a Solute Composed of a Mechanical Mixture of a Gadolinium Sesquioxide and of an Ytterbium Sesquioxide:

The solute was prepared by mechanically mixing 0.95 mol % of $Gd_2O_3$ and 0.05 mol % of $Yb_2O_3$.

The commercial $Gd_2O_3$ and $Yb_2O_3$ powders were mixed according to the stoichiometric proportions indicated above and then intimately ground in a mortar in order to obtain the finest particle size possible and the most homogeneous mechanical mixing possible.

2) Second Stage: Preparation of the Synthesis Solvent $[Li_6(Gd_{0.95}Yb_{0.05})(BO_3)_3]$ The solvent was synthesized according to the following reaction 2:

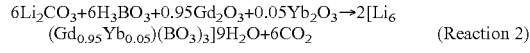

$6Li_2CO_3+6H_3BO_3+0.95Gd_2O_3+0.05Yb_2O_3 \rightarrow 2[Li_6(Gd_{0.95}Yb_{0.05})(BO_3)_3]9H_2O+6CO_2$ (Reaction 2)

The commercial $Li_2CO_3$, $H_3BO_3$, $Gd_2O_3$ and $Yb_2O_3$ powders were mixed according to the stoichiometric proportions indicated by reaction 2 above and then intimately ground in a mortar in order to obtain the finest particle size possible and the most homogeneous mechanical mixing possible. The mixture was subsequently heated in a platinum crucible under an air atmosphere according to the following heat treatment:

1) gradient of 180° C.h$^{-1}$ up to 450° C. and then a stationary phase lasting 12 h;

2) gradient of 180° C.h$^{-1}$ up to 750° C. and then a stationary phase lasting 12 h;

3) cooling down to ambient temperature with a cooling rate of 180° C.h$^{-1}$.

The synthesis solvent $[Li_6(Gd_{0.95}Yb_{0.05})(BO_3)_3]$ thus obtained was subsequently ground using a mortar and a pestle made of agate.

3) Third Stage: Crystallogenesis of the $Gd_2O_3$:$Yb^{3+}$ Single-Crystals 100 g (80 mol %) of synthesis solvent $[Li_6(Gd_{0.95}Yb_{0.05})(BO_3)_3]$ obtained above in stage 2) and 24.199 g (20 mol %) of the mechanical mixture of sesquioxides prepared above in stage 1) were intimately mixed and ground together in a mortar in order to obtain the finest particle size possible and the most homogeneous mechanical mixing possible. This mixture was subsequently placed in a platinum crucible.

The solution composed of $[Li_6(Gd_{0.95}Yb_{0.05})(BO_3)_3]$ (synthesis solvent) and of the solute was subsequently melted under the same conditions as those described above in example 1.

The crystallization of $Gd_2O_3$:$Yb^{3+}$ was carried out in the furnace described above in example 1, according to the protocol described in example 1, using, as crystallization support, a platinum paddle in the form of a shovel attached to an alumina rod and an air atmosphere and according to the following heat treatment program:

Starting temperature: 1200° C.
gradient of 1° C.h$^{-1}$ down to 1100° C.,
gradient of 180° C.h$^{-1}$ up to 1175° C.,
gradient of 0.7° C.h$^{-1}$ down to 1100° C.,
gradient of 180° C.h$^{-1}$ up to 1150° C.,
gradient of 0.5° C.h$^{-1}$ down to 1000° C.,
no pulling from the solution,
extraction of the paddle above the molten bath,
cooling down to ambient temperature at a rate of 44° C.h$^{-1}$.

Figure 6:
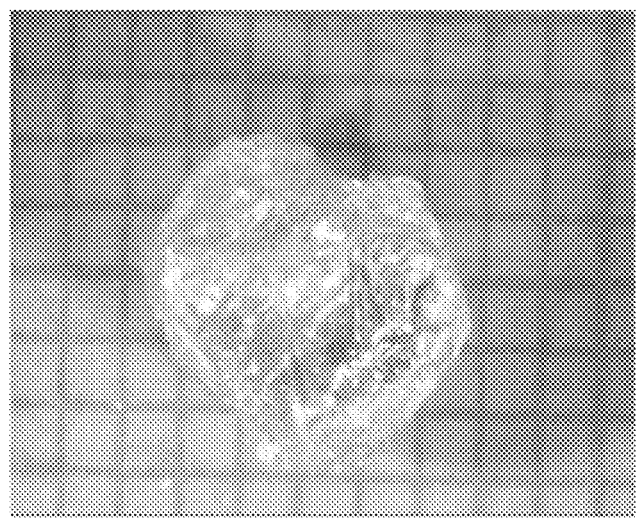
FIG. 6 is a photograph of the $Gd_2O_3:Yb^{3+}$ single-crystals of example 2.

$Gd_2O_3$:$Yb^{3+}$ single-crystals were obtained, a photograph of which is given by the appended FIG. 6 (magnification×20). In this figure, a $Gd_2O_3$:$Yb^{3+}$ crystal has been placed on a sheet of graph paper. It is found that the crystal exhibits a size of greater than 5 mm (length of the sides).

Figure 7:
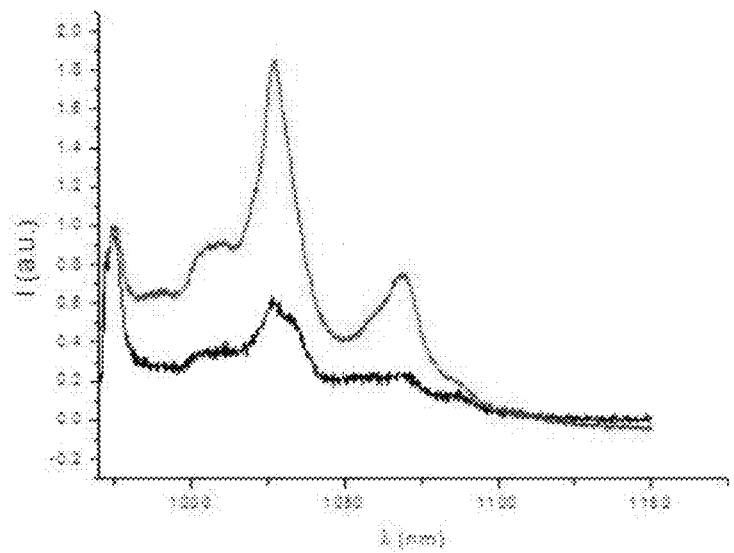
FIG. 7 is an emission spectrum of the $Gd_2O_3:Yb^{3+}$ of example 2.

The emission spectra in spectrofluorometry (recorded on the FluoroLog-3® device, excitation sources: 450 W Xe lamp at 240 nm (top curve) or InGaAs laser diode at 932 nm (bottom curve)) are given in the appended FIG. 7, in which the intensity of the emission (in arbitrary units) is a function of the wavelength λ (in nm).

The emission spectra represented in FIG. 7 show the incorporation of the trivalent ytterbium in the $Gd_2O_3$ matrix (position of the emission lines between the $^2F_{5/2}$ and $^2F_{7/2}$ levels in agreement with the literature: Doctoral Thesis 2006, Sana Hraiech, ibid).

Figure 8:
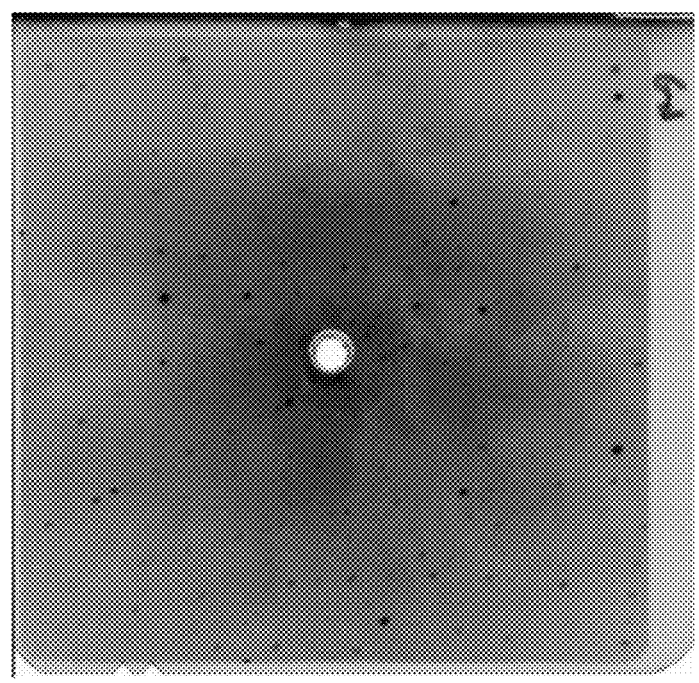
FIG. 8 is Laue diffraction diagram of example 2.

The Laue diffraction diagram is represented in the appended FIG. 8. Measurements were carried out on a natural face of an oriented (−2 −1 −1) $Gd_2O_3$:$Yb^{3+}$ single-crystal.

This diagram is in accordance with the expected theoretical structure and confirms the cubic structure of the $Gd_2O_3$:$Yb^{3+}$ single-crystal obtained.

Example 3

Crystallogenesis of $Lu_2O_3$ Single-Crystals, 5% (Molar) Doped with Ytterbium

In this example, single-crystal cubic sesquioxides of lutetium doped with ytterbium: $Lu_2O_3$:$Yb^{3+}$, were prepared using $[Li_6(Lu_{0.95}Yb_{0.05})(BO_3)_3]$ as synthesis solvent.

1) First Stage: Preparation of a Solute Composed of a Mixture of Lutetium Sesquioxide and Ytterbium Sesquioxide The solute was prepared by mechanically mixing 0.95 mol % of $Lu_2O_3$ and 0.05 mol % of $Yb_2O_3$.

The commercial $Lu_2O_3$ and $Yb_2O_3$ powders were mixed according to the stoichiometric proportions indicated above and then intimately ground in a mortar in order to obtain the finest particle size possible and the most homogeneous mechanical mixing possible.

2) Second Stage: Preparation of the Synthesis Solvent $[Li_6(Lu_{0.95}Yb_{0.05})(BO_3)_3]$ The solvent was synthesized according to the following reaction 3:

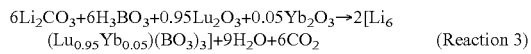

$6Li_2CO_3+6H_3BO_3+0.95Lu_2O_3+0.05Yb_2O_3 \rightarrow 2[Li_6(Lu_{0.95}Yb_{0.05})(BO_3)_3]+9H_2O+6CO_2$ (Reaction 3)

The commercial $Li_2CO_3$, $H_3BO_3$, $Lu_2O_3$ and $Yb_2O_3$ powders were mixed according to the stoichiometric proportions indicated by reaction 3 above and then intimately ground in a mortar in order to obtain the finest particle size possible and the most homogeneous mechanical mixing possible. The mixture was subsequently heated in a platinum crucible under an air atmosphere according to the following heat treatment:

1) gradient of 180° $C.h^{-1}$ up to 450° C. and then a stationary phase lasting 12 h;
2) gradient of 180° $C.h^{-1}$ up to 750° C. and then a stationary phase lasting 12 h;
3) cooling down to ambient temperature with a cooling rate of 180° $C.h^{-1}$.

The synthesis solvent $[Li_6(Lu_{0.95}Yb_{0.05})(BO_3)_3]$ thus obtained was subsequently ground using a mortar and a pestle made of agate.

3) Third Stage: Crystallogenesis of the $Lu_2O_3:Yb^{3+}$ Single-Crystals 46.365 g (80 mol %) of synthesis solvent $[Li_6(Lu_{0.95}Yb_{0.05})(BO_3)_3]$ obtained above in stage 2) and 11.733 g (20 mol %) of the mechanical mixture of sesquioxides prepared above in stage 1) were intimately mixed and ground together in a mortar in order to obtain the finest particle size possible and the most homogeneous mechanical mixing possible. This mixture was subsequently placed in a platinum crucible.

The solution composed of $[Li_6(Lu_{0.95}Yb_{0.05})(BO_3)_3]$ (synthesis solvent) and of the solute was subsequently melted under the same conditions as those described above in example 1.

The crystallization of $Lu_2O_3:Yb^{3+}$ was carried out in the furnace described above in example 1, according to the protocol described in example 1, using, as crystallization support, a paddle in the form of a shovel attached to an alumina rod and an air atmosphere and according to the following heat treatment program:

Starting temperature: 1200° C.
gradient of 0.5° $C.h^{-1}$ down to 1000° C.,
no pulling from the solution,
extraction of the paddle above the molten bath,
cooling down to ambient temperature at a rate of 44° $C.h^{-1}$.

Figure 9:
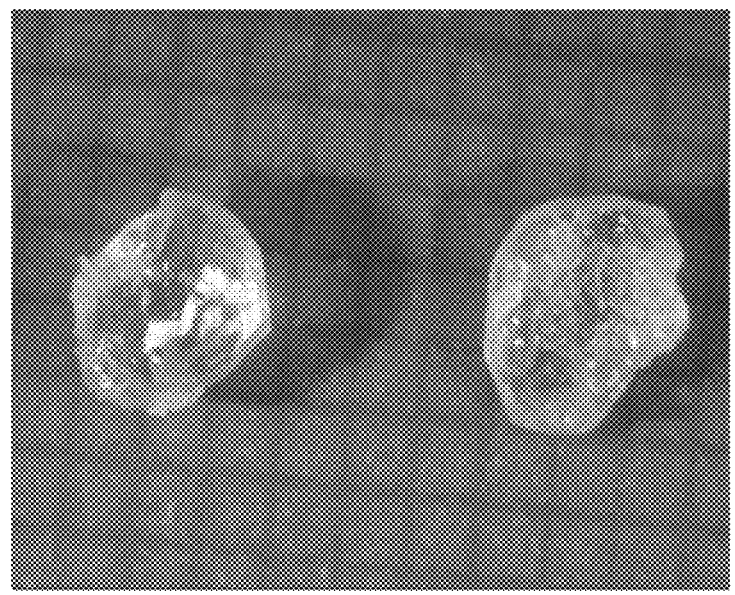
FIG. 9 is a photograph of the $Lu_2O_3:Yb^{3+}$ single-crystals of example 3.

$Lu_2O_3:Yb^{3+}$ single-crystals were obtained, a photograph of which is given by the appended FIG. 9 (magnification×20 approximately). In this figure, two $Lu_2O_3:Yb^{3+}$ crystals have been placed on a sheet of graph paper. It is found that the crystals exhibit a size of greater than 3 mm (length of the sides).

Figure 10:
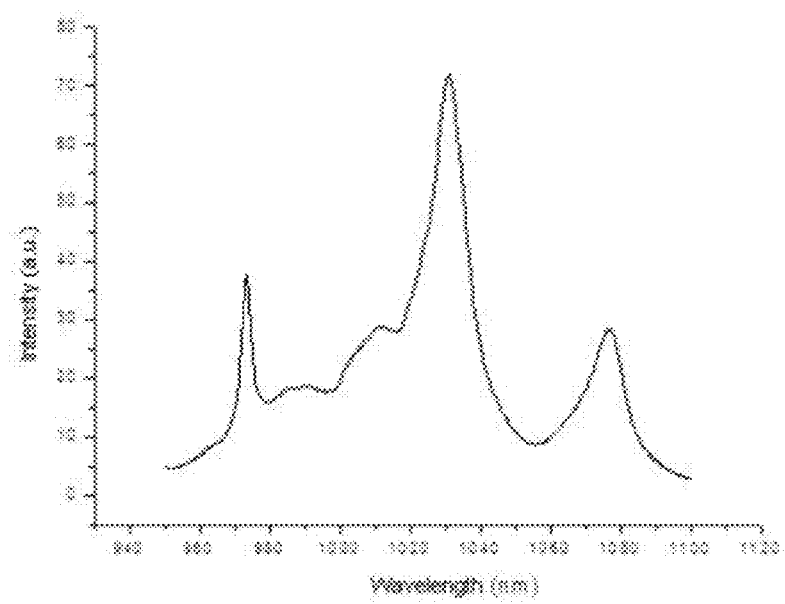
FIG. 10 is an emission spectrum of the $Lu_2O_3:Yb^{3+}$ of example 3.

The emission spectrum in spectrofluorometry (recorded on the FluoroLog-3® device, excitation sources: 450 W Xe lamp at 240 nm) is given in the appended FIG. 10, in which the intensity of the emission (in arbitrary units) is a function of the wavelength λ (in nm).

The emission spectrum represented in FIG. 10 shows the incorporation of the trivalent ytterbium in the $Lu_2O_3$ matrix (position of the emission lines between the $^2F_{5/2}$ and $^2F_{7/2}$ levels in agreement with the literature: Doctoral Thesis 2006, Sana Hraiech, ibid).

Figure 11:
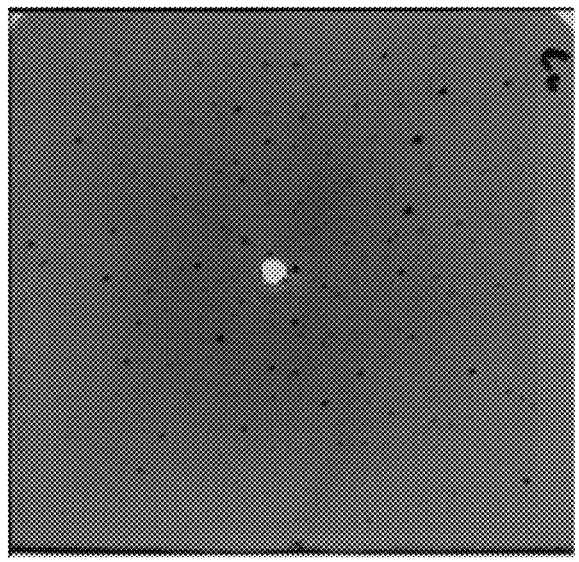
FIG. 11 is Laue diffraction diagram of example 3.

The Laue diffraction diagram is represented in the appended FIG. 11. Measurements were carried out on a natural face of an oriented (−2 −1 −1) $Lu_2O_3:Yb^{3+}$ single-crystal.

This diagram is in accordance with the expected theoretical structure and confirms the cubic structure of the $Lu_2O_3:Yb^{3+}$ single-crystal obtained.

Example 4

Crystallogenesis of $Gd_2O_3$ Single-Crystals 10% (Molar) Doped with Ytterbium

In this example, single-crystal cubic sesquioxides of gadolinium doped with ytterbium: $Gd_2O_3:Yb^{3+}$, were prepared using $[Li_6(Gd_{0.9}Yb_{0.1})(BO_3)_3]$ as synthesis solvent.

1) First Stage: Preparation of a Solute Composed of a Mechanical Mixture of Gadolinium Sesquioxide and of Ytterbium Sesquioxide:

The solute was prepared by mechanically mixing 0.9 mol % of $Gd_2O_3$ and 0.1 mol % of $Yb_2O_3$.

The commercial $Gd_2O_3$ and $Yb_2O_3$ powders were mixed according to the stoichiometric proportions indicated above and then intimately ground in a mortar in order to obtain the finest particle size possible and the most homogeneous mechanical mixing possible.

2) Second Stage: Preparation of the Synthesis Solvent $[Li_6(Gd_{0.9}Yb_{0.1})(BO_3)_3]$ The solvent was synthesized according to the following reaction 4:

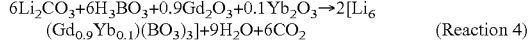

$6Li_2CO_3+6H_3BO_3+0.9Gd_2O_3+0.1Yb_2O_3 \rightarrow 2[Li_6(Gd_{0.9}Yb_{0.1})(BO_3)_3]+9H_2O+6CO_2$ (Reaction 4)

The commercial $Li_2CO_3$, $H_3BO_3$, $Gd_2O_3$ and $Yb_2O_3$ powders were mixed according to the stoichiometric proportions indicated by reaction 4 above and then intimately ground in a mortar in order to obtain the finest particle size possible and the most homogeneous mechanical mixing possible. The mixture was subsequently heated in a platinum crucible under an air atmosphere according to the following heat treatment:

1) gradient of 120° $C.h^{-1}$ up to 505° C. and then a stationary phase lasting 12 h;
2) gradient of 120° $C.h^{-1}$ up to 800° C. and then a stationary phase lasting 12 h;
3) gradient of 180° $C.h^{-1}$ up to 1250° C. and then a stationary phase lasting 2 h;
4) cooling down to ambient temperature with a cooling rate of 180° $C.h^{-1}$.

The synthesis solvent $[Li_6(Gd_{0.9}Yb_{0.1})(BO_3)_3]$ thus obtained was subsequently ground using a mortar and a pestle made of agate.

3) Third Stage: Crystallogenesis of the $Gd_2O_3:Yb^{3+}$ Single-Crystals 133.3062 g (80 mol %) of synthesis solvent $[Li_6(Gd_{0.9}Yb_{0.1})(BO_3)_3]$ obtained above in stage 2) and 32.4 g (20 mol %) of the solute prepared above in stage 1) were intimately mixed and ground together in a mortar in order to obtain the finest particle size possible and the most homogeneous mechanical mixing possible. This mixture was subsequently placed in a platinum crucible.

The solution composed of [Li$_6$(Gd$_{0.9}$Yb$_{0.1}$)(BO$_3$)$_3$] (synthesis solvent) and of the solute was subsequently melted under the same conditions as those described above in example 1.

The crystallization of Gd$_2$O$_3$:Yb$^{3+}$ was carried out in the furnace described above in example 1, according to the protocol described in example 1, using, as crystallization support, a platinum paddle in the form of a shovel attached to an alumina rod and an air atmosphere and according to the following heat treatment program:

Starting temperature: 20° C.
gradient of 136.7° C.h$^{-1}$ up to 1250° C. and then a stationary phase lasting 1 h,
gradient of 180° C.h$^{-1}$ down to 1200° C. and then a stationary phase lasting 1 h,
gradient of 0.5° C.h$^{-1}$ down to 1100° C.,
gradient of 180° C.h$^{-1}$ up to 1150° C.,
gradient of 0.3° C.h$^{-1}$ down to 1000° C.,
no pulling from the solution,
extraction of the paddle above the molten bath at 1000° C., cooling dawn to 800° C. at a rate of 2° C.h$^{-1}$.
cooling down to ambient temperature at a rate of 60° C.h$^{-1}$.

Figure 12:
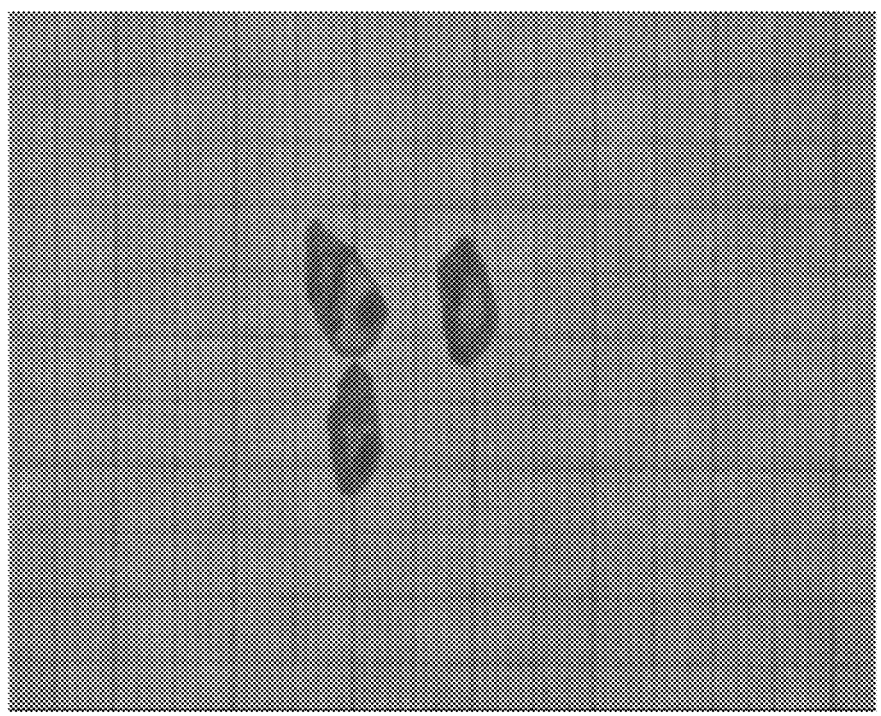
FIG. 12 is a photograph of the $Gd_2O_3:Yb^{3+}$ single-crystals of example 4.

Gd$_2$O$_3$:Yb$^{3+}$ single-crystals were obtained, a photograph of which is given by the appended FIG. 12. In this figure, the Gd$_2$O$_3$:Yb$^{3+}$ crystals have been placed on a sheet of graph paper. It is found that the crystals exhibit a size of the order of a centimeter (large length).

Figure 13:
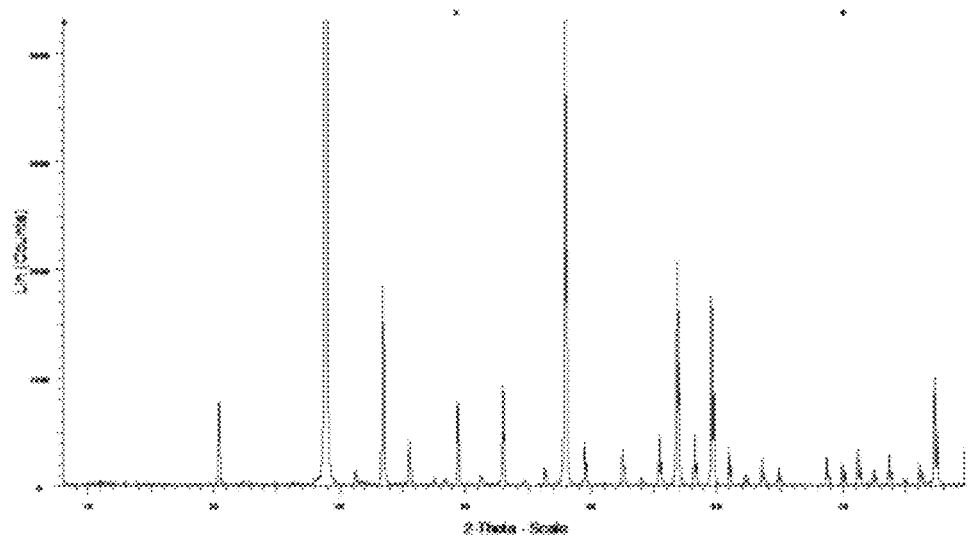
FIG. 13 is an emission spectrum of the $Gd_2O_3:Yb^{3+}$ of example 4.

A crystal was ground and the powder obtained was analyzed by X-ray diffraction. The apparatus used is a PANalytical X'Pert MPD diffractometer in Bragg-Brentano (θ-θ) geometry Cu-Kα (λ=1.54187 Å). The powder diffraction diagram is represented in the appended FIG. 13.

This diagram is in accordance with the expected theoretical structure and confirms the cubic structure of the Gd$_2$O$_3$:Yb$^{3+}$ single-crystal obtained.

The invention claimed is:

1. A process for the preparation of a bulk or thin-film single-crystal formed of a matrix of a cubic sesquioxide of scandium, yttrium and/or rare earth metal doped with at least one element of the series of the lanthanides, said single-crystal corresponding to the following formula (I):

$$R^1_2O_3:R^2 \quad (I)$$

in which:
R$^1$ is at least one metal with a valency of III selected from the group consisting of scandium, yttrium and the elements of the series of the lanthanides;
R$^2$ is at least one element selected from the group consisting of the series of the lanthanides;
wherein said process is carried out in a chemically inert crucible and in that it comprises the following stages consisting in:

1) preparing a pulverulent mixture (PM1) comprising at least:
one solute formed of a mechanical mixture of at least one sesquioxide of following formula (IIa) in a molar percentage (1-x) and of at least one sesquioxide of following formula (IIb) in a molar percentage (x):

$$(R'^1_2O_3)_{1-x}(\text{IIa}) + (R'^2_2O_3)_x \quad (\text{IIb})$$

in which R'$^1$ is identical to R$^1$, R'$^2$ is identical to R$^2$ and 0<x≤25 mol %, said solute being present in the mixture PM1 in an amount z such that 5<z≤30 mol %,
a synthesis solvent of following formula (III):

$$[Li_6(R''^1_{1-x'}R''^2_{x'})(BO_3)_3] \quad (III)$$

in which:
R''$^1$ and R''$^2$ are respectively identical to R$^1$ and to R$^2$ and x'=x;

2) bringing the pulverulent mixture PM1 obtained above in stage 1) to a temperature T$_{PM1}$ at least equal to the melting point (T$_{M.p.}$) of said mixture and ≤1250° C., in order to bring about the dissolution of the solute in the solvent of formula (III) and to obtain a liquid solution of said solute in the solvent of formula (III);

3) maintaining the temperature of the liquid solution at the temperature T$_{PM1}$ for a period of time of at least 6 hours, with stirring by means of a solid support subjected to rotation around a vertical axis;

4) the controlled cooling of the liquid solution from the temperature T$_{PM1}$ down to a temperature T$_{Exp}$ between the saturation temperature (T$_{Sat}$) of the liquid solution and the critical supersaturation temperature (CT$_{Super}$) of the liquid solution or the temperature of solidification of the solution, in order to bring about the controlled crystallization of the expected sesquioxide of formula (I) on said solid support immersed in said liquid solution and subjected to rotation around a vertical axis, said cooling being carried out at a maximum rate of 1° C.h$^{-1}$; and 5) the withdrawal of the solid support from the liquid solution and then the controlled cooling of the sesquioxide of formula (I) crystallized on the solid support from the temperature T$_{Exp}$ down to ambient temperature, at a maximum rate of 50° C.h$^{-1}$.

2. The process according to claim 1, wherein R$^1$ is selected from the group consisting of the elements Y, Gd, Sc, Lu combined elements Y/Gd, Y/Sc, Gd/Sc, Lu/Sc, Gd/La, Gd/Lu and Y/Lu.

3. The process according to claim 1, wherein R$^2$ is selected from the group consisting of the elements Yb, Tm, Er, Pr, Tb, Nd, Ce, Ho, Eu, Sm, Dy, combined elements Yb/Tm, Yb/Pr, Tm/Ho, Er/Yb, Yb/Tb, Yb/Ho and Tm/Tb.

4. The process according to claim 1, wherein said process is employed for the preparation of sesquioxides of formula (1) selected from the group consisting of Y$_2$O$_3$:Yb; Y$_2$O$_3$:Pr; Y$_2$O$_3$:Eu, Y$_2$O$_3$:Nd; Y$_2$O$_3$:Tm; Gd$_2$O$_3$:Yb; Gd$_2$O$_3$:Pr; Gd$_2$O$_3$:Eu; Gd$_2$O$_3$:Nd; Gd$_2$O$_3$:Tm; Lu$_2$O$_3$Yb; Lu$_2$O$_3$:Pr; Lu$_2$O$_3$:Eu; Lu$_2$O$_3$:Nd; Lu$_2$O$_3$:Tm; (Y,Gd)$_2$O$_3$:Yb; (Y,Gd)$_2$O$_3$:Pr; (Y,Gd)$_2$O$_3$:Eu; (Y,Gd)$_2$O$_3$:Nd; (Y,La)$_2$O$_3$:Pr; (Gd,La)$_2$O$_3$:Pr; (Gd,La)$_2$O$_3$:Yb; (Gd,La)$_2$O$_3$:Eu; (Gd,La)$_2$O$_3$:Nd; (Y,La)$_2$O$_3$:Yb; Y$_2$O$_3$:Er:Yb; Y$_2$O$_3$:Pr:Yb; Gd$_2$O$_3$:Er:Yb; Gd$_2$O$_3$:Pr:Yb; Gd$_2$O$_3$:Tm:Yb; Lu$_2$O$_3$:Tm:Yb; Y$_2$O$_3$:Tm:Ho; Y$_2$O$_3$:Tm:Yb, Y$_2$O$_3$:Tm:Tb, Sc$_2$O$_3$:Eu, (Y,Lu)$_2$O$_3$:Eu and (Gd,Lu)$_2$O$_3$:Eu.

5. The process according to claim 1, wherein the amount z of solute present in the pulverulent mixture PM1 is >10 mol % and ≤30 mol %.

6. The process according to claim 1, wherein 0<x=x'≤5 mol %.

7. The process according to claim 1, the pulverulent mixture PM1 produced during stage 1) and comprising the solute formed of the mechanical mixture of the sesquioxides of formulae (IIa) and (IIb) and the synthesis solvent of formula (III) is prepared according to a process comprising the sub-stages consisting in:

i) preparing, by mechanical grinding, a pulverulent mixture (PM2) comprising 6 mol of Li$_2$CO$_3$, 6 mol of H$_3$BO$_3$ and (1+z') mol of the mechanical mixture of the sesquioxides of formulae (IIa) and (IIb), with z'/(2+z')= z;

ii) subjecting the mixture PM2 to a heat treatment comprising:
- a rise in temperature up to a temperature $T_1$ of from 400 to 500° C., according to a temperature rise gradient of from 120 to 180° C.h$^{-1}$,
- a stationary phase during which the temperature $T_1$ is maintained for from 6 to 12 hours,
- a rise in temperature up to a temperature $T_2$ of from 700 to 800° C., according to a temperature rise gradient of from 120 to 180° C.h$^{-1}$,
- a stationary phase during which the temperature $T_2$ is maintained for from 6 to 12 hours,
- a return to ambient temperature with a cooling gradient of from 120 down to 180° C.h$^{-1}$, in order to obtain a solid material in the form of particles, said material being composed of the synthesis solvent of formula (III) as a mixture with z mol % of solute; and iii) mechanically grinding the solid material obtained above in stage ii) in order to obtain the pulverulent mixture PM1.

8. The process according to claim 1, wherein, during stage 2), the temperature $T_{PM1}$ is from 1200° C. to 1250° C. and the rate at which the mixture PM1 is brought to the temperature $T_{PM1}$ is 120° C.h$^{-1}$.

9. The process according to claim 1, wherein, during stage 4), the temperature $CT_{Super}$ is of 1000° C. and the controlled cooling of the liquid solution from the temperature $T_{PM1}$ down to a temperature $T_{Exp}$ is carried out at a rate of from 0.1 to 1° C.h$^{-1}$.

10. The process according to claim 1, wherein the solid crystallization support is composed of a platinum paddle or of a platinum wire attached to an alumina rod or alternatively of an oriented crystal seed attached to a platinum wire itself suspended from an alumina rod.

11. The process according to claim 10, wherein the solid support is an oriented single-crystal or polycrystalline seed of the same chemical and/or structural nature as the solute which is immersed in the liquid solution and in that the growth is carried out by liquid phase epitaxy.

12. The process according to claim 1, wherein stages 3) and 4) are carried out in a vertical tubular furnace equipped with a paddle for homogenizing and countering sedimentation of the liquid solution and which can act as crystallization support, said paddle being integral with a mechanical rotation/translation/weighing system via the solid crystallization support attached to an alumina rod itself connected to the rotation/pulling/weighing system.

13. The process according to claim 1, wherein, during stages 3) and 4), and 5), the rotational speed of the solid support varies from 20 to 50 revolutions/min.

14. The process according to claim 13, wherein the rotational speed of the solid support varies from 20 to 35 revolutions/min during the controlled cooling stages 4) and 5).

15. The process according to claim 1, wherein the cooling of stage 4) is carried out at a rate of 0.5° C.h$^{-1}$ from the temperature $T_{PM1}$ down to a temperature $CT_{Super}$ of 1000° C., after extracting the support from the liquid and positioning the support above the liquid solution, and then the temperature of 1000° C. is maintained for a time of less than 1 hour before carrying out the cooling mentioned in stage 5).

16. The process according to claim 15, wherein the cooling of stage 5) is carried out at a rate of less than 50° C.h$^{-1}$.

17. The process according to claim 1, wherein the cooling of stage 4) is a heat treatment comprising an alternation of cooling stages and of temperature-rise stages in which the amplitude of each temperature-rise stage is less than the amplitude of the cooling stage which precedes it.

18. The process according to claim 17, wherein the cooling of stage 4) is carried out according to the following heat treatment:
i) cooling the liquid solution from the temperature $T_{PM1}$ down to 1150° C. at a rate of 1° C.h$^{-1}$,
ii) rise in temperature from 1150° C. to 1180° C. at a rate of 120° C.h$^{-1}$,
iii) cooling from 1180° C. to 1100° C. at a rate of 0.7° C.h$^{-1}$,
iv) rise in temperature from 1100° C. to 11150° C. at a rate of 120° C.h$^{-1}$,
v) cooling from 1150° C. to 1000° C. ($CT_{Super}$) at a rate of 0.5° C.h$^{-1}$.

19. The process according to claim 17, wherein the coding of stage 5) is carried out at a rate of 50° C.h$^{-1}$.

* * * * *

UNITED STATES PATENT AND TRADEMARK OFFICE
CERTIFICATE OF CORRECTION

Page 1 of 1

PATENT NO. : 9,187,845 B2
APPLICATION NO. : 13/505632
DATED : November 17, 2015
INVENTOR(S) : Veber et al.

It is certified that error appears in the above-identified patent and that said Letters Patent is hereby corrected as shown below:

IN THE CLAIMS
Column 20, Claim 19, Line 40: The word "coding" between the words "the" and "of" should read as: "cooling"

Signed and Sealed this
Twenty-third Day of February, 2016

Michelle K. Lee
*Director of the United States Patent and Trademark Office*